United States Patent
Hachigo et al.

(10) Patent No.: US 7,960,284 B2
(45) Date of Patent: Jun. 14, 2011

(54) III-V COMPOUND SEMICONDUCTOR SUBSTRATE MANUFACTURING METHOD

(75) Inventors: Akihiro Hachigo, Itami (JP); Naoki Matsumoto, Itami (JP); Takayuki Nishiura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 625 days.

(21) Appl. No.: 12/018,198

(22) Filed: Jan. 23, 2008

(65) Prior Publication Data

US 2008/0176400 A1    Jul. 24, 2008

(30) Foreign Application Priority Data

Jan. 23, 2007    (JP) .................................. 2007-012658

(51) Int. Cl.
   *H01L 21/302* (2006.01)
(52) U.S. Cl. ............ 438/691; 257/E21.222; 257/E21.23
(58) Field of Classification Search .......................... None
   See application file for complete search history.

(56) References Cited

U.S. PATENT DOCUMENTS

| | | | |
|---|---|---|---|
| 6,444,593 B1 * | 9/2002 | Ngo et al. ...................... | 438/788 |
| 6,455,398 B1 * | 9/2002 | Fonstad et al. ................. | 438/459 |
| 6,488,767 B1 * | 12/2002 | Xu et al. ........................... | 117/2 |
| 7,078,344 B2 * | 7/2006 | Bailey et al. ................... | 438/692 |
| 7,129,167 B1 * | 10/2006 | Bailey et al. ................... | 438/677 |
| 7,159,599 B2 * | 1/2007 | Verhaverbeke et al. ...... | 134/109 |
| 7,585,686 B2 * | 9/2009 | Verhaverbeke et al. ........ | 438/16 |
| 7,602,046 B2 * | 10/2009 | Ghyselen et al. ............. | 257/618 |
| 7,732,301 B1 * | 6/2010 | Pinnington et al. ........... | 438/455 |
| 2003/0045098 A1 * | 3/2003 | Verhaverbeke et al. ...... | 438/689 |
| 2007/0018284 A1 * | 1/2007 | Nakayama et al. ........... | 257/613 |
| 2007/0093071 A1 * | 4/2007 | Verhaverbeke et al. ...... | 438/724 |
| 2007/0284696 A1 * | 12/2007 | Matsumoto ................... | 257/615 |
| 2008/0085477 A1 * | 4/2008 | Verhaverbeke et al. ...... | 430/322 |
| 2008/0138917 A1 * | 6/2008 | Verhaverbeke et al. ........ | 438/16 |

(Continued)

FOREIGN PATENT DOCUMENTS

| | | |
|---|---|---|
| EP | 1679740 A1 | 7/2006 |
| JP | H02-207527 A | 8/1990 |
| JP | H05-291231 A | 11/1993 |

(Continued)

OTHER PUBLICATIONS

V. S. Wang et al., "Triple-Crystal X-Ray Diffraction Analysis of Reactive Ion Etched Gallium Arsenide," Journal of Applied Physics Apr. 15, 1994, pp. 3835-3841, vol. 75, No. 8, American Institute of Physics, NY.

*Primary Examiner* — Allan Olsen
(74) *Attorney, Agent, or Firm* — James W. Judge

(57) ABSTRACT

Affords a III-V compound semiconductor substrate manufacturing method that enables enhancement of the substrate PL intensity. In such a III-V compound semiconductor substrate manufacturing method, first, the surface 3*a* of a wafer 3 is polished (polishing step). Second, the surface 3*a* of the wafer 3 is cleaned (first cleaning step S7). Next, the surface 3*a* of the wafer 3 is subjected to first dry-etching, employing a halogen-containing gas, while first bias voltage is applied to a chuck 24 for carrying the wafer 3. Subsequently, the surface 3*a* of the wafer 3 is subjected to second dry-etching, employing the halogen-containing gas (second dry-etching step S11), while second bias power lower than the first bias power is applied to the chuck 24.

6 Claims, 4 Drawing Sheets

U.S. PATENT DOCUMENTS

| | | | |
|---|---|---|---|
| 2008/0145797 A1* | 6/2008 | Verbeke et al. | 430/322 |
| 2008/0176400 A1* | 7/2008 | Hachigo et al. | 438/691 |
| 2008/0230780 A1* | 9/2008 | Urashima | 257/51 |
| 2008/0286697 A1* | 11/2008 | Verhaverbeke et al. | 430/322 |
| 2009/0029550 A1* | 1/2009 | Matsumoto | 438/691 |
| 2009/0278233 A1* | 11/2009 | Pinnington et al. | 257/615 |

FOREIGN PATENT DOCUMENTS

| | | |
|---|---|---|
| JP | 2002-289579 A | 10/2002 |
| JP | 2006-060069 A | 3/2006 |
| JP | 2006-185964 A | 7/2006 |
| WO | WO-2005-041283 A1 | 5/2005 |

\* cited by examiner

III-V COMPOUND SEMICONDUCTOR SUBSTRATE MANUFACTURING METHOD

BACKGROUND OF THE INVENTION

1. Technical Field

The present invention relates to methods of manufacturing Group III-V compound semiconductor substrates.

2. Description of the Related Art

III-V compound semiconductor substrates are manufactured by slicing off substrates from an ingot, and polishing and thereafter cleaning the substrate surfaces. (Cf. Japanese Unexamined Pat. App. Pub. No. H05-291231.)

Polishing the surface of a III-V compound semiconductor substrate, however, subjects the surface to damage. As a consequence, the substrate's photoluminescence intensity (PL intensity) is degraded. Forming semiconductor devices on the surface of a III-V compound substrate that carries damage is a futile exercise, if outstanding device characteristics are sought.

Given that polishing produces superficial damage on III-V compound substrates, the present inventors investigated dry-etching the post-polished surface as a means of removing the damage-affected material. The results of their investigations confirmed improvement in the PL intensity of III-V compound substrates. Nevertheless, further improvement in III-V semiconductor substrate PL intensity is being sought, in order yield prevailing superior device characteristics.

BRIEF SUMMARY OF THE INVENTION

An object of the present invention, brought about in view of the circumstances described above, is to make available a III-V compound semiconductor substrate manufacturing method whereby the PL intensity of the III-V substrates can be improved.

In order to resolve the issues discussed above, a III-V compound semiconductor substrate manufacturing method of the present invention includes: a polishing step of polishing a surface of a platelike III-V compound semiconductor crystal; a cleaning step, subsequent to the polishing step, of cleaning said surface of the III-V compound semiconductor crystal; a first dry-etching step, subsequent to the cleaning step, of applying first bias power to an electrode for carrying the III-V compound semiconductor crystal, and meanwhile subjecting said III-V compound semiconductor crystal surface to first dry-etching employing a first halogen-containing gas; and a second dry-etching step, subsequent to the first dry-etching step, of applying to the electrode second bias power that is less than the first bias power, and meanwhile subjecting said III-V compound semiconductor crystal surface to second dry-etching employing a second halogen-containing gas.

Herein, the first and second halogen-containing gases employed respectively in the first and second dry-etching steps may be of the same type, or may be different from each other.

In the III-V compound semiconductor substrate manufacturing method of the present invention, the III-V compound semiconductor crystal surface is damaged during the polishing step. The damage can be subsequently removed by carrying out the first and second dry-etching steps following the cleaning step. Furthermore, the fact that bias power in the second dry-etching is smaller than that in the first dry-etching means that the III-V compound semiconductor crystal surface less likely to be damaged by the second dry-etching itself. The III-V compound semiconductor substrate PL intensity therefore can be improved.

Furthermore, in the polishing step, the III-V compound semiconductor crystal surface is preferably polished until the arithmetic-mean roughness of the surface decreases to 50 Å or less.

It will be appreciated that the arithmetic-mean roughness can be decreased in the polishing step by, for example, decreasing the mean grain diameter of the abrasive particles.

Performing polishing in the manner as described above makes the arithmetic-mean roughness ($Ra_2$) after the second dry-etching step smaller than arithmetic-mean roughness ($Ra_1$) before the first dry-etching step. For this reason, the planarity of the III-V compound semiconductor substrate surface can be improved.

Moreover, it is preferable that: the III-V compound semiconductor crystal surface has an elemental Group III-substance face and an elemental Group V-substance face; the polishing step includes a chemical polishing process of chemically polishing the III-V compound semiconductor crystal surface; and as at least one of a chemical solution employed in the chemical polishing process and a cleaning solution employed in the cleaning step, a solution containing at least one among aqueous hydrogen peroxide, sulfuric acid, hydrochloric acid, nitric acid, and hydrofluoric acid is utilized.

Herein, the term "chemical polishing" means that so-called chemical mechanical polishing (CMP) is included.

Employing such a solution makes it possible to prevent the elemental V-substance face (such as the N face) from being etched selectively relative to the elemental III-substance face by at least one of the chemical solution and the cleaning solution, in at least one of the chemical polishing step and the cleaning step. Preventing such selective etching keeps difference in height between the elemental III-substance and the elemental V-substance faces from increasing, meaning that the III-V compound semiconductor substrate surface planarity can be improved.

Furthermore, the III-V compound semiconductor crystal preferably contains as the elemental III substance at least one among Ga, In, and Al, and as the elemental V substance at least one among As, P, and N.

In such a III-V compound semiconductor crystal, the atomic weights of the elemental III substance and the elemental V substance are comparatively small, which facilitates polishing and dry-etching the III-V compound semiconductor crystal surface.

The present invention affords III-V compound semiconductor substrate manufacturing methods that enable improvement of III-V compound semiconductor substrate PL intensity.

DETAILED DESCRIPTION OF THE INVENTION

Hereinafter, referring to the accompanying drawings, an explanation of embodiments of the present invention will be made in detail. It should be understood that in describing the drawings, with the same reference marks being used for identical or equivalent features, reduplicating description will be omitted.

Figure 1:
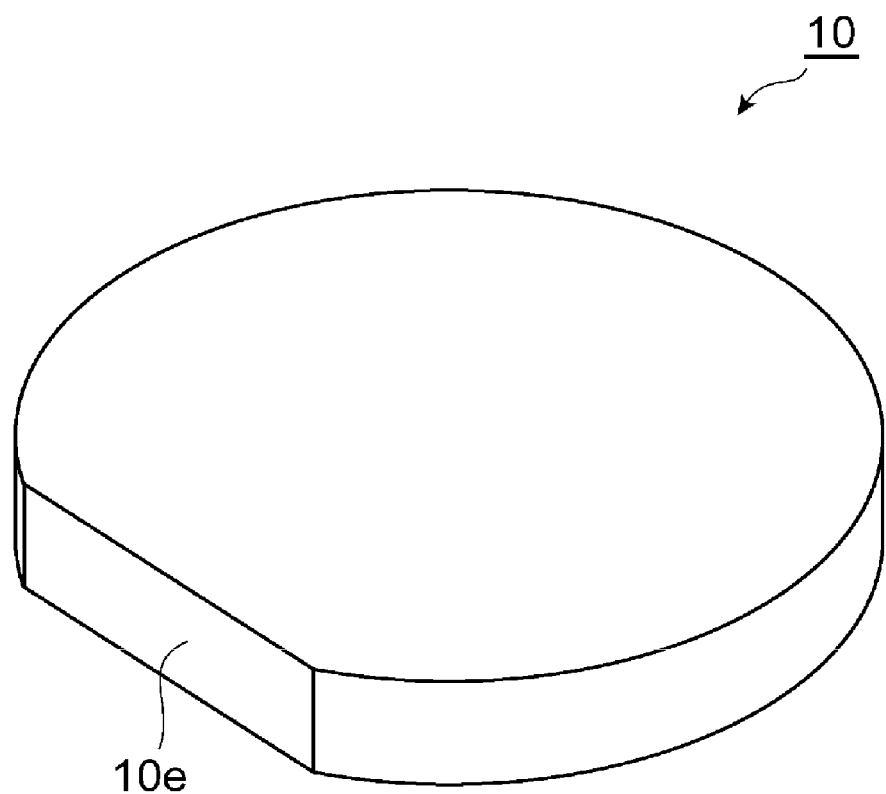
FIG. 1 is an oblique view schematically illustrating a III-V compound semiconductor substrate manufactured by a III-V compound semiconductor substrate manufacturing method involving an embodiment of the present invention.

FIG. 1 is a schematic perspective view showing a III-V compound semiconductor substrate manufactured by the III-V compound semiconductor substrate manufacturing method involving embodiments of the present invention. An orientation flat 10e is formed on the edge of a III-V compound semiconductor substrate 10 (substrate 10, hereinafter) illustrated in FIG. 1. In place of the orientation flat 10e, a notch may be formed.

The substrate 10 preferably contains as the elemental III substance at least one of Ga, In, and Al, and as the elemental V substance at least one of As, P and N. The substrate 10 may be, to cite exemplary substrates, a GaAs, GaP or InP substrate, or a nitride semiconductor substrate (III-V compound semiconductor substrate containing N as the elemental V substance) such as a GaN, AlN or InN substrate. The substrate 10 may be an impurity-doped substrate, a substrate composed of a ternary III-V compound semiconductor, or a substrate composed of a quaternary III-V compound semiconductor such as GaInNAs. Also, the substrate 10 may be a single-crystal substrate, or a polycrystalline substrate.

Figure 2:
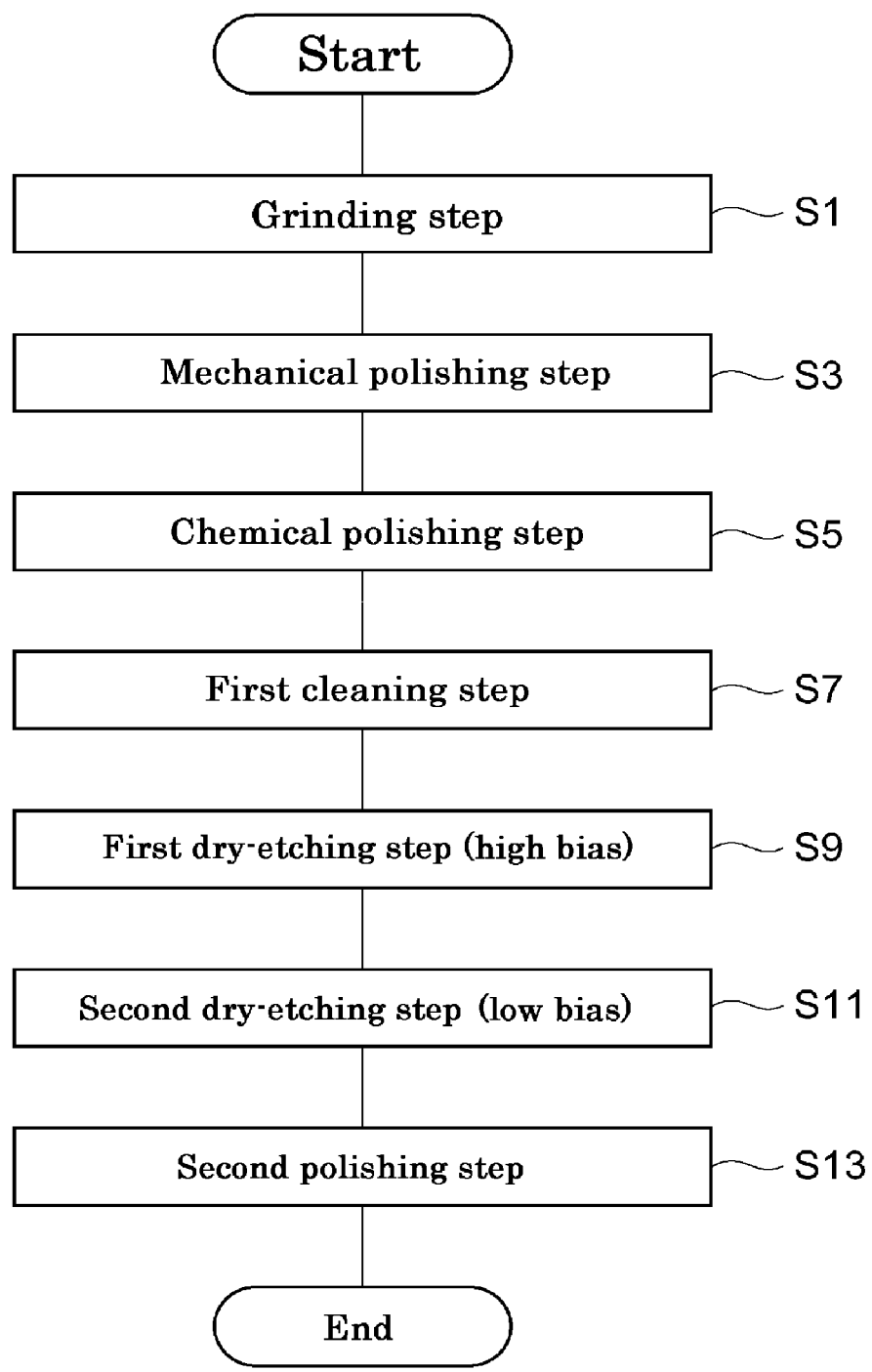
FIG. 2 is a flow chart representing steps in a III-V compound semiconductor substrate manufacturing method involving the present embodiment.

FIG. 2 is a flow chart representing steps of a III-V compound semiconductor substrate manufacturing method involving embodiments of the present invention. The substrate 10 illustrated in FIG. 1 is manufactured in the following manner, for example.

In an exemplary implementation in which the substrate 10 is a GaAs substrate or an InP substrate, an ingot is first created by, for example, the liquid encapsulated Czochralski (LEC) method, by vapor-phase epitaxy such as the halogen transport method, or by the horizontal Bridgeman (HB) method. Next, the ingot is peripherally processed so as to have the desired diameter. Subsequently, a crystallographic orientation of the ingot is determined by X-ray diffraction, and then an orientation flat (OF) and an index flat (IF) are formed on the ingot. Furthermore, the ingot is sliced with a wire saw, outer diameter saw, internal diameter saw, or like cutting tool to separate wafers (platelike III-V compound semiconductor crystals) from the ingot.

Meanwhile, in an exemplary implementation in which the substrate 10 is a nitride semiconductor substrate, nitride semiconductor crystal is grown by vapor phase techniques on a non-native crystal substrate whose thermal expansion coefficient is close to that of the nitride semiconductor of which the nitride semiconductor substrate is composed. Examples of non-native substrates include Si, GaAs, SiC and sapphire. After that, a wafer may be produced from the nitride semiconductor crystal by separating away the non-native substrate, or wafers may be cut from the vapor-phase-grown nitride semiconductor crystal by slicing it employing, for example, a wire saw, outer diameter saw, internal diameter saw, or other cutting tool.

Next, the surface of the produced wafer is planarized. Planarization is carried out by putting the wafer through the process steps represented in FIG. 2. The wafer surface that is planarized is at least one of either the principal face or the back side (face on the opposite side from the principal face) of the wafer.

Grinding Step

First, the wafer surface is ground (grinding step S1). In the grinding step S1, the wafer is attached with wax to, for example, a ceramic plate, and a diamond grinding wheel is while being rotated pressed against the wafer surface, while grinding fluid is supplied to between the wafer and the diamond wheel. In this manner, the wafer surface is ground with the diamond wheel.

Polishing Step

Second, the wafer surface is polished. It is preferable that the wafer surface is mechanically polished (mechanical polishing step S3), and then is chemically polished (chemical polishing process S5).

In the mechanical polishing step S3, a copper or tin platen is pressed against the wafer surface while being rotated, while a polishing agent (for example, diamond slurry) is supplied to between the surface of the wafer attached to the ceramic plate and the platen. In this manner, the wafer surface is polished with the polishing agent. Herein, it is preferable that the mechanical polishing step S3 is repeated more than once, and every time the mechanical polishing step S3 is repeated, the mean grain diameter of the abrasive particles contained in the polishing agent is gradually decreased.

In the chemical polishing step S5, a polishing pad (for example, a suede-like pad) is pressed against the wafer surface while being rotated, while a chemical solution is supplied to between the surface of the wafer attached to the ceramic plate and the polishing pad. As a result, the contaminants (for example, the wax and polishing agent) and metal ions adhering to the wafer surface can be removed.

The chemical solution employed in the chemical polishing step S5 preferably has no, or little, reactivity with III-V compound semiconductor substrates, and preferably removes metal ions and contaminants. Examples of such chemical solutions include solutions containing at least among aqueous hydrogen peroxide, sulfuric acid, hydrochloric acid, nitric acid, and hydrofluoric acid. In particular, aqueous hydrogen peroxide is preferable because it has mild acidity, and thus its damage on the polishing device and associated components is slight.

Generally, sulfuric acid, hydrofluoric acid, hydrochloric acid, nitric acid, phosphoric acid, aqueous ammonia, potassium hydrate, and sodium hydrate are well known as etchants for III-V compound semiconductors.

For example, when employed singly, with the exception of hydrochloric acid, etchants such as sulfuric acid and nitric acid etch GaAs crystal and InP crystal only slightly; GaAs and InP crystals are etched with a combination of the above etchants.

On the other hand, as to GaN crystal, AlN crystal and other nitride semiconductor crystals, employing, for example, etchants such as phosphoric acid, aqueous ammonia, potassium hydrate, or sodium hydrate results in that the N faces of the nitride semiconductor crystals are readily etched, but their elemental III-substance faces, such as Ga and Al faces, are etched only slightly. For this reason, on the wafer surface having both an elemental III-substance face and a N face, there is a risk that the difference in height between the elemental III-substance face and the N face increases. Compared with these etchants, utilizing as etchant a liquid containing at least one of aqueous hydrogen peroxide, sulfuric acid, hydrochloric acid, nitric acid, or hydrofluoric acid results in that both the elemental III-substance face and the N face are etched only slightly, preventing difference in height between the elemental III-substance face and the N face from increasing.

First Cleaning Step

Next, the wafer surface is cleaned (a first cleaning step S7). In the first cleaning step S7, first, the wafer is detached from the ceramic plate. Next, in order to remove wax and polishing agent clinging to the wafer surface, ultrasonic cleaning in which as solvent, ethanol, for example, is utilized is performed. Furthermore, the wafer is soaked in, for example, hydrochloric acid, and is oscillated, to remove metal ions clinging to the wafer surface. To oscillate the wafer, the cleaning jig is vibrated and ultrasonic cleaning is performed; in particular, performing ultrasonic cleaning is preferable. Subsequently, the wafer surface is rinsed under flowing ultrapure water. Next, the wafer is dried employing, for example, isopropyl alcohol vapor.

As cleaning solution employed for wafers such as GaAs substrates and InP substrates in the first cleaning step, a cleaning fluid employed to clean Si substrates may utilized, and a chemical solution may be combined with the cleaning fluid. Furthermore, as cleaning solution employed for GaN substrates, AlN substrates and other nitride semiconductor substrates in the first cleaning step, a liquid containing, similarly to the chemical solution employed in the chemical polishing process S5, at least one of aqueous hydrogen peroxide, sulfuric acid, hydrochloric acid, nitric acid, or hydrofluoric acid is preferably utilized. Utilizing such a solution lessens difference between the speed at which the elemental III-substance face (for example, Ga face or Al face) is etched, and the speed at which the N face is etched.

First Dry-Etching Step

Figure 3:
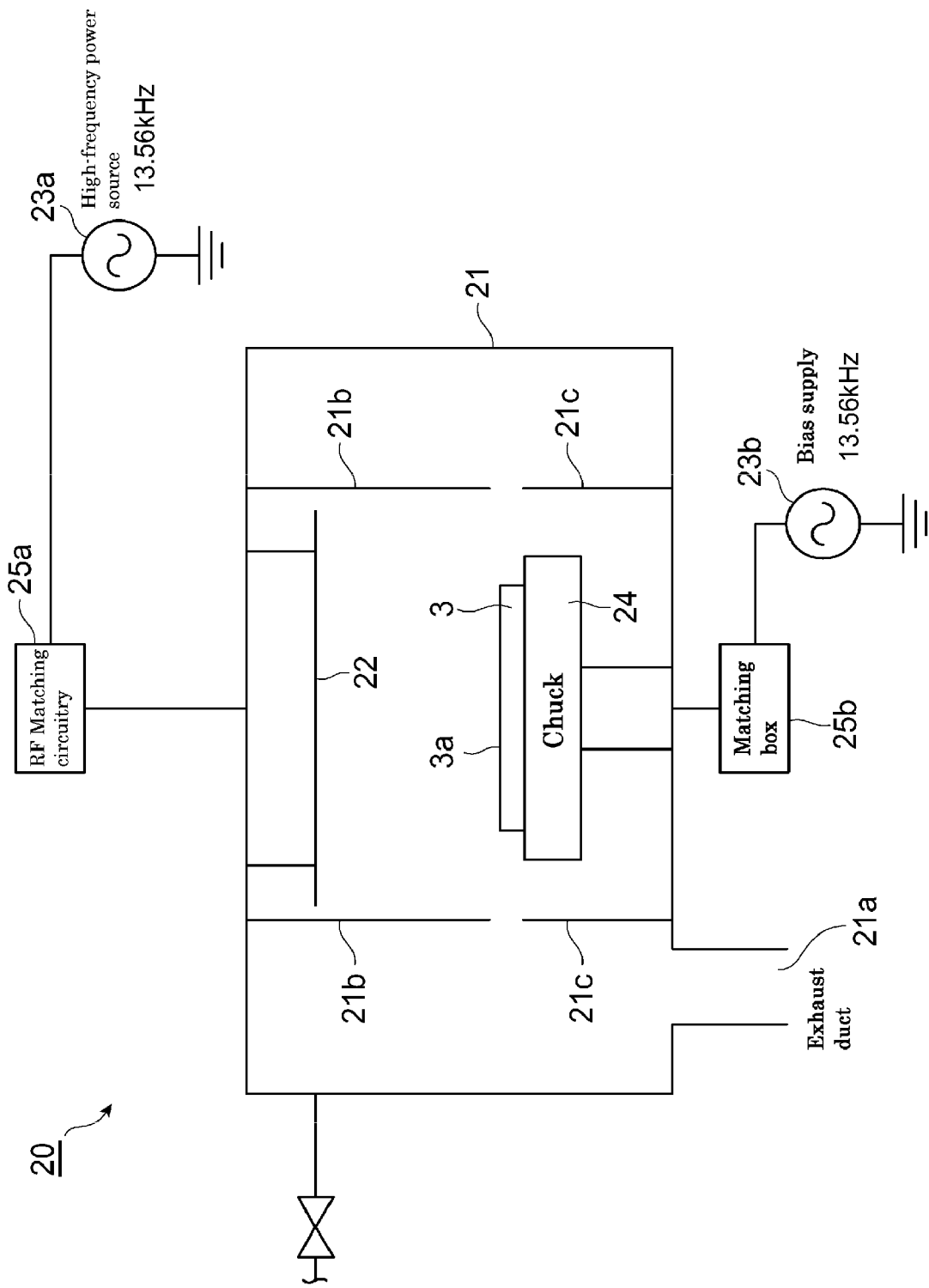
FIG. 3 is a diagram schematically illustrating a plasma etching apparatus.

Next, the surface 3a of a wafer 3 is subjected to first dry-etching, employing a plasma etching apparatus 20 as illustrated in FIG. 3 (first dry-etching (high bias) step S9). It is preferable that the surface 3a of the wafer 3 is entirely dry-etched. Furthermore, reactive dry etching (RIE) is preferably adopted as the dry etching.

FIG. 3 is a schematic diagram illustrating a plasma etching apparatus. A plasma etching apparatus 20 as illustrated in FIG. 3 is provided with a chamber 21, an antenna 22, a high-frequency power source 23a, a bias supply 23b, a chuck 24, and RF matching circuitry 25a and 25b.

The chamber 21 is a unit for housing the wafer 3, and the interior of the chamber 21 is kept high-temperature and low-pressure. The antenna 22, which is one electrode for generating plasma within the chamber 21, is disposed in the upper part of the chamber 21. The antenna 22 is in the form of a flat or spiral coil. The antenna 22 is electrically linked via the RF matching circuitry 25a to the high-frequency power source 23a for generating high RF power at, for example, 13.56 MHz.

The chuck 24 is a constituent element for carrying and holding the wafer 3. The chuck 24 is electrically linked via the RF matching circuitry 25b to the bias supply 23b. The bias supply 23b applies to the chuck 24 high-frequency bias power of, for example, 13.56 MHz. The chuck 24 acts as an electrode for applying bias power to the wafer 3. Between the antenna 22 and the chuck 24, plasma is generated by the high-frequency power supply 23a. The generated plasma is accelerated toward the chuck 24 by an electric field set up by the bias power.

Within the chamber 21, shields 21b and 21c for blocking electromagnetic waves generated by the high-frequency voltage are provided so as to surround the chuck 24. Additionally, an exhaust duct 21a for discharging exhaust gas produced from the reaction between the reaction gas fed into the chamber 21 and the wafer 3 is provided on a sidewall of the chamber 21.

The plasma etching apparatus 20 is employed as follows. First, the interior of the chamber 21 is kept high-temperature and low-pressure, and the wafer 3 is held on the chuck 24. Subsequently, the reaction gas is fed to the interior of the chamber 21. Additionally, the high-frequency voltage is applied to the antenna 22, and the bias voltage to the chuck 24, to generate plasma within the chamber 21. In the plasma, the reaction gas is converted into active species including radicals and ions, which are accelerated toward the wafer 3 by the bias voltage. As a result, the radicals and ions in the plasma react with the wafer 3, and thus dry etching progresses.

In the first dry-etching step S9, first bias power (high bias) is applied to the chuck, and meanwhile the surface 3a of the wafer 3 is subjected to the first dry-etching, 24 employing a halogen-containing gas. Examples of halogens contained in the reaction gas include fluorine (F), chlorine (Cl), bromine (Br), and iodine (I).

Second Dry-Etching Step

Subsequent to the first dry-etching step S9, a second dry etching step (low bias) S11 is carried out. In the second dry-etching step S11, second bias power (low bias) lower than the first bias power is applied to the chuck 24, and meanwhile the surface 3a of the wafer 3 is subjected to the second dry-etching, employing as reaction gas a halogen-containing gas.

Examples of the reaction gas employed in the first dry-etching step S9 and second dry-etching step S11 include gaseous fluorine ($F_2$), gaseous chlorine ($Cl_2$), gaseous iodine ($I_2$), gaseous boron trichloride ($BCl_3$), and a gaseous mixture ($BCl_3+CF_4$) of gaseous boron trichloride ($BCl_3$) and gaseous carbon tetrafluoride ($CF_4$). The types of reaction gases employed in the first dry-etching step S9 and in the second dry-etching step S11 may be the same as, or be different from, each other.

In dry etching, more than one wafer 3 can be processed simultaneously. When the wafer 3 is arranged in the plasma etching apparatus 20, from within the atmosphere it is introduced into a vacuum processing chamber. A tray made of, for example, Al, for housing the wafer 3 can be employed in order to arrange, transport, and process the wafer. The tray is preferably resistant to the halogen-containing gases. Examples of such a tray include an Al tray coated with alumina and other ceramics, a tray made of $SiO_2$ grass such as quarts, a tray made of polycrystalline silicon, silicon nitride, silicon carbide and other Si-base materials, a tray made of carbon composite, diamond and other C-base materials, a boron nitride tray, and a tungsten carbide tray. The diamond tray, due to its high thermal conductivity, can lessen the influence of temperature rise during dry etching. Therefore, the wafer 3 can be stably dry-etched. Trays made of Si-based material are also preferable because they have high thermal conductivity and relatively high durability, are inexpensive, and have fewer mixed-in impurities.

Second Cleaning Step

Next, the wafer surface is cleaned (a second cleaning step S13). The second cleaning step S13 may be a similar step to the first cleaning step S7. The substrate 10 is manufactured in this manner.

As described above, in the III-V compound semiconductor substrate manufacturing method involving the embodiments of the present invention, the surface 3a of the wafer 3 is damaged in the mechanical polishing step S3 and chemical polishing step S5. The damage can be subsequently removed by carrying out the first dry-etching step S9 and second dry-etching step S11 following the first cleaning step S7. Furthermore, the fact that bias power in the second dry-etching is lower than that in the first dry-etching makes the III-V compound semiconductor crystal surface less likely to be damaged by the second dry-etching itself. The PL intensity of the manufactured substrate 10 therefore can be enhanced.

Moreover, in the mechanical polishing step S3 and chemical polishing step S5, the surface 3a of the wafer 3 is preferably polished until arithmetic-mean roughness of the surface 3a of the wafer 3 decreases to 50 Å or less. Performing polishing in this manner makes arithmetic-mean roughness ($Ra_2$) after the second dry-etching step S11 smaller than arithmetic-mean roughness ($Ra_1$) before the first dry-etching step S9. For this reason, planarity of the surface of the manufactured substrate 10 can be heightened.

Furthermore, in the wafer 3 whose surface 3a has elemental III-substance face and N face, carrying out the first dry-etching step S9 and second dry-etching step S11 lessens the difference in height between the elemental III-substance face and the N face.

In addition, it is preferable that: the surface 3a of the wafer 3 has a elemental III-substance face and a N face; the polishing process includes the chemical polishing step S5; and as at least one of a chemical solution employed in the chemical polishing process S5 and a cleaning solution employed in the first cleaning step S7, a solution containing at least one of aqueous hydrogen peroxide, sulfuric acid, hydrochloric acid, nitric acid, and hydrofluoric acid is utilized. Employing such a liquid prevents the elemental V-substance face (for example, N face) from being etched selectively relative to the elemental III-substance face by at least one of the chemical solution and cleaning solution in at least one of the chemical polishing process S5 and first cleaning step S7. Preventing this selective etching keeps the difference in height between the elemental III-substance face and the elemental V-substance face from increasing, meaning that the planarity of the surface of the manufactured substrate 10 can be heightened.

Moreover, the wafer 3 preferably contains as the elemental III substance at least one of Ga, In, and Al, and contains as the elemental V substance at least one of As, P, and N. In such a wafer 3, the atomic weights of the elemental III substance and the elemental V substance are comparatively small, which facilitates polishing and dry-etching the surface 3a of the wafer 3.

In the foregoing, an explanation has been made of preferable modes for embodying the present invention, but the present invention is not limited to them. For example, in the polishing step, the chemical polishing process S5 may not be carried out.

While the following explains the present invention more specifically on the basis of embodiments and comparative examples, the present invention is not limited the following embodiments.

First, the inventors of the present invention conducted the following Experiments 1 through 3.

Experiment 1

A 2-inch diameter GaAs substrate, a 2-inch diameter InP substrate, and a 2-inch diameter GaN substrate were prepared. The substrate surfaces were each ground to bring the substrate thickness to 400 µm. Subsequently, the substrate surfaces were polished with a diamond wheel having diamond abrasive particles 3 µm in mean grain diameter, and then were polished with a diamond wheel having diamond abrasives 1 µm in average diameter. After that, the substrate surfaces were cleaned.

Next, the substrate surfaces were dry-etched employing a plasma etching apparatus, and then were cleaned. The conditions under which dry etching were performed are shown below.

Antenna power: 800 W
Bias power: 400 W
Etch time: 90 seconds
Reaction gas: iodine gas ($I_2$)
Reaction gas flow rate: 30 sccm
Pressure in chamber: 0.2 Pa
Evaluation Result Arithmetic-mean roughness ($Ra_{11}$) of the substrate surfaces before, and their arithmetic-mean roughness ($Ra_{12}$) after, dry etching, were characterized with an atomic-force microscope (AFM). The area over which the characterization was performed was defined as a rectangular area of 10 µm×10 µm on the substrate surfaces. In addition, surface roughness ratios ($Ra_{12}/Ra_{11}$) were calculated. Table I sets forth the results.

Additionally, substrate PL intensity ($I_{11}$) before, and substrate PL intensity ($I_{12}$) after, dry etching, were measured. The PL intensities were measured by irradiating the substrates with an He—Cd laser to excite them, and measuring the intensity of the excitation peak. The PL intensity ratios ($I_{12}/I_{11}$) were then calculated. The results are set forth in Table I.

TABLE I

| Substrate | Surface roughness ratio | PL intensity ratio |
| --- | --- | --- |
| GaAs substrate | 0.84 | 1.34 |
| InP substrate | 0.78 | 1.37 |
| GaN substrate | 0.81 | 1.65 |

Experiment 1 in the foregoing verified decrease in surface roughness and improvement in PL intensity by means of a III-V compound semiconductor substrate manufacturing method including: a polishing step of polishing the wafer surface; a cleaning step, subsequent to the polishing step, of cleaning the wafer surface; and a dry-etching step, subsequent to the cleaning step, of subjecting the wafer surface to dry etching.

Experiment 2

GaAs substrates 2 inches in diameter and GaN substrates 2 inches in diameter were prepared. After that, the substrate surfaces were polished with a diamond wheel having diamond abrasives 3 µm in average diameter, and then were polished with a diamond wheel having diamond abrasives 1 µm in average diameter. Subsequently, the substrate surfaces were cleaned. In addition, the substrates were divided into eight portions, and then with different types of reaction gases, the surfaces of the portions were dry-etched employing a plasma etching apparatus. The conditions under which the dry etching was performed are shown below.

Antenna power: 800 W
Bias power: 200 W
Etch time: 90 seconds
Reaction gas flow rate: 30 sccm
Pressure in chamber: 0.2 Pa As to reaction gases, gaseous chlorine ($Cl_2$), gaseous iodine ($I_2$), gaseous boron trichloride ($BCl_3$), a gaseous mixture ($BCl_3+CF_4$) of gaseous boron trichloride ($BCl_3$) and gaseous carbon tetrafluoride ($CF_4$), gaseous argon (Ar), gaseous nitrogen ($N_2$), and gaseous oxygen ($O_2$) were utilized. Additionally, in employing the gaseous mixture ($BCl_3+CF_4$), a ratio between the flow rate of the gaseous boron trichloride ($BCl_3$) and that of the gaseous carbon tetrafluoride ($CF_4$) was made 1:1.

Evaluation Result

As in Experiment 1, surface roughness ratios ($Ra_2/Ra_1$) and PL intensity ratios ($I_2/I_1$) were calculated. The results are set forth in Table II.

TABLE II

| | GaAs substrate | | GaN substrate | |
| --- | --- | --- | --- | --- |
| Reaction gas | Surface roughness ratio | PL intensity ratio | Surface roughness ratio | PL intensity ratio |
| $Cl_2$ | 0.82 | 1.34 | 0.73 | 2.16 |
| $I_2$ | 0.79 | 1.42 | 0.76 | 1.73 |
| $BCl_3$ | 0.97 | 1.05 | 0.99 | 1.01 |
| $BCl_3 + CF_4$ | 0.83 | 1.16 | 0.86 | 1.21 |
| Ar | 1.28 | 0.70 | 1.19 | 0.76 |
| $N_2$ | 1.00 | 0.95 | 1.00 | 0.98 |
| $O_2$ | 1.08 | 0.78 | 1.06 | 0.83 |

Experiment 2 in the foregoing verified decrease in surface roughness and improvement in PL intensity by means of a III-V compound semiconductor substrate manufacturing method including: a polishing step of polishing the wafer surface; a cleaning step, subsequent to the polishing step, of cleaning the wafer surface; and a dry-etching step, subsequent to the cleaning step, of subjecting the wafer surface to dry etching employing a halogen-containing gas.

Experiment 3

Specular-polished GaAs substrates 2 inches in diameter and specular-polished GaN substrates 2 inches in diameter were prepared. Additionally, as trays for housing the substrates while they were etched, Al trays, quartz trays, silicon carbide trays, polycrystalline Si trays, and polycrystalline Si trays coated with polycrystalline diamond (diamond trays hereinafter) were prepared. In each of the five types of trays, three of the GaAs substrates were cleaned, and then arranged in a circle so that the centers of the GaAs substrates were spaced 8 cm from the center of each tray. In the same manner, three of the GaN substrates were cleaned, and then arranged in a circle so that the centers of the GaN substrates were spaced 8 cm from the center of each of the five types of the trays. Subsequently, the substrate surfaces were dry-etched employing a plasma etching apparatus. The conditions under which dry etching were performed are shown below.

Antenna power: 800 W
Bias power: 200 W
Etch time: 90 seconds
Reaction gas: chlorine gas ($Cl_2$)
Reaction gas flow rate: 30 sccm
Pressure in chamber: 0.2 Pa Evaluation Result The substrate surfaces that had been dry-etched were analyzed by auger electron spectroscopy (AES). As a result, when the Al trays were employed, a prominent Al peak was observed. Furthermore, when the Al tray after dry etching was left in the open air for one hour, and discoloration caused by tray corrosion was found. With the trays other than the Al trays, Si that is main component of the trays was not observed, and no discoloration was found even after the trays were left in the open air for one hour.

Moreover, planarity of the substrate surfaces that had been dry-etched was measured with a contact-type surface roughness gauge, and the in-plane flatness uniformity was calculated. The calculation of the in-plane flatness uniformity was performed for that of the three substrates which was arranged in the same position in each tray. The in-plane flatness uniformity was calculated in the following manner. First, arithmetic-mean roughness was measured in a scan field of 1 mm at a total of five points—one of which was in proximity to the substrate center point, and four of which were points 10 mm inward from the substrate outer periphery. Next, the difference between the maximum and the minimum in the measured five arithmetic-mean roughnesses in the scanning range of 1 mm totally was calculated, and the difference was defined as the in-plane flatness uniformity. As a result, it was verified that the in-plane flatness uniformities decrease in the order: (1) diamond tray; (2) silicon carbide tray; (3) Al tray; (4) polycrystalline Si tray; and (5) quartz tray. That is, the diamond tray was most high in in-plane flatness uniformity. The result demonstrates that the higher the thermal conductivity, the higher the in-plane flatness uniformity. Among the four types of trays except for the Al tray, form the perspective of durability and in-plane flatness uniformity, the diamond trays and silicon carbide trays are preferable. For this reason, silicone carbide trays, readily-available at low cost, were employed in the following experiment.

Above-described Experiment 3 demonstrated the advantageousness of a III-V compound semiconductor substrate manufacturing method including: a polishing step of polishing the surface of platelike III-V compound semiconductor crystal; a cleaning step, subsequent to the polishing step, of cleaning the III-V compound semiconductor crystal surface; and a dry-etching step, subsequent to the cleaning step, of placing the III-V compound semiconductor crystal in the silicon carbide tray to dry-etch the III-V compound semiconductor crystal surface. Such a III-V compound semiconductor substrate manufacturing method improves tray durability, and enhances in-plane flatness uniformity of the substrate surface.

Next, based on above Experiments 1 to 3, the inventors of the present invention carried out the following test embodiments and comparative examples.

Embodiment 1

A 2-inch diameter InP substrate was prepared. The InP substrate surface was polished with a diamond wheel having diamond abrasives 3 μm in average diameter, and subsequently was polished with a diamond wheel having diamond abrasives 1 μm in average diameter. After that, the InP substrate surface was cleaned.

Next, the InP substrate surface was subjected to the first dry-etching, employing the plasma etching apparatus. The conditions under which the first dry-etching was performed are shown below.

Antenna power: 800 W
Bias power: 400 W
Etch time: 45 seconds
Reaction gas: iodine gas ($I_2$)
Reaction gas flow rate: 30 sccm
Pressure in chamber: 0.2 Pa Next, the InP substrate surface was subjected to the second dry-etching, employing the plasma etching apparatus. Apart from making the bias power 100 W, the conditions under which the second dry-etching was performed were the same as the conditions under which the first dry-etching was performed. Accordingly, the total time for the first dry-etching and second dry-etching was 90 seconds. The InP substrate was fabricated in this manner.

Embodiment 2

Apart from making the bias power 200 W in the second dry-etching conditions, the InP substrate was fabricated in the same manner as in Embodiment 1.

Comparative Example 1

Apart from bringing the bias power to 400 W in the second dry-etching conditions, the InP substrate was fabricated in the same manner as in Embodiment 1.

Comparative Example 2

Apart from increasing the bias power to 500 W in the second dry-etching conditions, the InP substrate was fabricated in the same manner as in Embodiment 1.

Comparative Example 3

Apart from bringing the bias power to 600 W in the second dry-etching conditions, the InP substrate was fabricated in the same manner as in Embodiment 1.

Embodiments 3 and 4

Apart from employing a 2-inch diameter GaN substrate in place of the 2-inch diameter InP substrate, the GaN substrate was produced in the same manner as in Embodiments 1 and 2.

Comparative Examples 4 to 6

Apart from employing the 2-inch diameter GaN substrate in place of the 2-inch diameter InP substrate, the GaN substrate was produced in the same manner as in Comparative Examples 1 to 3.

Evaluation Result

The arithmetic-mean roughnesses (Ra1) of the substrate surfaces before the first dry-etching and the arithmetic-mean roughnesses (Ra2) of the substrate surfaces after the second dry-etching were measured by AFM. The region in which measurement was performed was defined as a rectangular area of 10 μm×10 μm on the substrate surfaces. Subsequently, based on the arithmetic-mean roughnesses (Ra1), surface roughness ratios ($Ra_2/Ra_1$) were calculated. The results are set forth in Table III.

Furthermore, the substrate PL intensities ($I_1$) before the first dry-etching and the substrate PL intensities ($I_2$) after the second dry-etching were measured. The PL intensities were measured by irradiating the substrates with an He—Cd laser having an emission wavelength of 325 nm to optically stimulate the substrates, and then measuring the peak intensity of the excitation beam. PL intensity ratios ($I_2/I_1$) were then calculated. The results are set forth in Table III.

TABLE III

| | Substrate type | Bias power during second dry-etching (W) | Surface roughness ratio | PL intensity ratio |
|---|---|---|---|---|
| Emb. 1 | InP substrate | 100 | 0.73 | 1.40 |
| Emb. 2 | | 200 | 0.76 | 1.39 |
| Comp. Ex. 1 | | 400 | 0.78 | 1.37 |
| Comp. Ex. 2 | | 500 | 0.95 | 1.28 |
| Comp. Ex. 3 | | 600 | 1.02 | 1.24 |
| Emb. 3 | GaN substrate | 100 | 0.78 | 1.70 |
| Emb. 4 | | 200 | 0.79 | 1.69 |
| Comp. Ex. 4 | | 400 | 0.81 | 1.65 |
| Comp. Ex. 5 | | 500 | 0.87 | 1.47 |
| Comp. Ex. 6 | | 600 | 0.93 | 1.38 |

Additionally, the inventors of the present invention conducted the following experiments 4 to 6.

Experiment 4

GaN substrates 2 inches in diameter were prepared. At a constant antenna power, the bias power was varied to dry-etch the GaN substrate surfaces. The conditions under which dry etching was performed are shown below.

Figure 4:
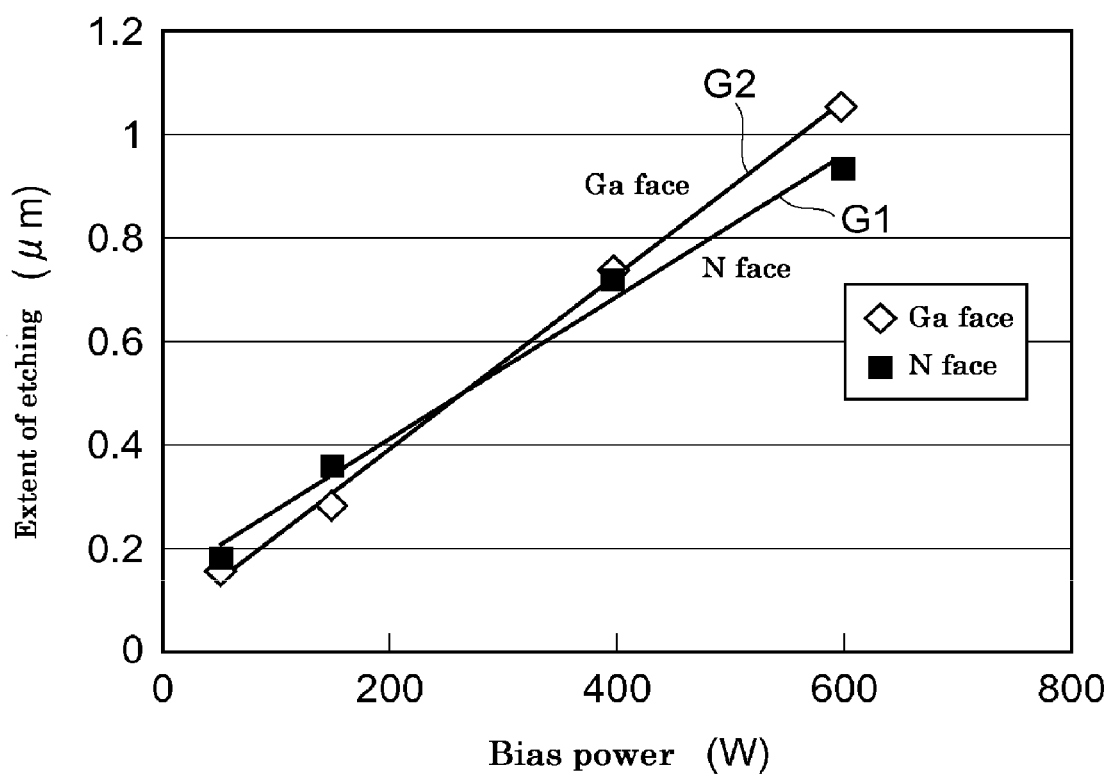
FIG. 4 is a graph plotting relationships between bias power and etching extent.

Antenna power: 800 W
Etch time: 90 seconds
Reaction gas: chlorine gas ($Cl_2$)
Reaction gas flow rate: 30 sccm
Pressure in chamber: 0.2 Pa Evaluation Result Because GaN substrates have polarity, the extents to which Ga face was etched and to which N face was etched were separately measured by a contact type surface roughness measuring instrument. The results are set forth in FIG. 4. FIG. 4 is a graph demonstrating the relationship between the bias power and the etching extents. In FIG. 4, line G1 represents the extent to which the N face was etched per given time, and line G2 represents the extent to which the Ga face is etched per given time. The graph indicates that at a bias power of less than 300 W, the extent to which N face is etched per given time is greater than the extent to which Ga face is etched per given time. At a bias power of less than 300 W, the action of chlorine radicals predominates. On the other hand, the graph shows that at a bias power of more than 300 W, the extent to which N face is etched for the predetermined time is smaller than the extent to which Ga face is etched for the predetermined time. At a bias power of more than 300 W, the action of chlorine ions predominates. As just described, varying the bias power makes it possible to control which of the speed at which Ga face is etched and the speed at which N face is etched is higher.

As just described, Experiment 4 demonstrated the difference in height between the elemental III-substance face and the N face can be controlled by means of a III-V compound semiconductor substrate manufacturing method in which the wafer surface has an elemental III-substance face and N face, and that includes: a polishing step of polishing the wafer surface; a cleaning step, subsequent to the polishing step, of cleaning the wafer surface; and a dry etching step, subsequent to the cleaning step, of subjecting the wafer surface to dry etching employing a halogen-containing gas.

Experiment 5

GaN substrates 2 inches in diameter and AlN substrates 10 square mm were prepared. Next, with the substrates being attached to the ceramic plate, polishing was performed employing aqueous hydrogen peroxide of 10 mass percent concentration with a suede-like polishing pad, in order to remove the contaminants (for example, wax and polishing agent) and metal ions clinging to the substrate surfaces. The reason why aqueous hydrogen peroxide was selected as the chemical solution is that with aqueous hydrogen peroxide, the N face is not selectively etched (eroded), and the mild acidity of the aqueous hydrogen peroxide is less likely to damage the polishing system. The conditions under which polishing was performed are shown below.

Platen diameter: 380 mm
Polishing pad: Politex™
Platen rotational speed: 60 rpm
Load: 300 g/cm$^2$
Polishing agent supply: 500 cc/min Evaluation Result Table IV sets forth, in chemically polishing the substrates employing various chemical solutions, the abilities of the solutions to etch the N face (N-face etching power) and to corrode the SUS steel polishing system (SUS-steel etching power), and the rate at which difference in height occurs. Herein, colloidal silica in Table IV means $SiO_2$ powder of 10 nm average particle diameter is contained in KOH as the polishing agent. Herein, because the pH gauging probe is made of glass, the pH of the HF could not be measured.

TABLE IV

| Chemical solution | pH | N-face etching power | SUS-steel etching power | Height-difference occurrence rate (μm/h) GaN substrate | Height-difference occurrence rate (μm/h) AlN substrate |
|---|---|---|---|---|---|
| Colloidal silica | 11 | Present | Weak | 2 | 1.5 |
| KOH | 14 | (unsuitable) | | 1.5 | 1.2 |
| NaOH | 14 | | | 1.5 | 1.2 |
| NH$_4$OH | 12 | Slightly present (somewhat unsuitable) | | 0.2 | 0.1 |
| H$_2$O$_2$ | 3 | Absent (suitable) | | 0 | 0 |
| H$_3$PO$_4$ | 1 | Present (unsuitable) | Strong | 0.5 | 0.4 |
| HNO$_3$ | 1 | Absent (suitable) | | 0 | 0 |
| H$_2$SO$_4$ | 1 | | | 0 | 0 |
| HF | — | | | 0 | 0 |
| HCl | 1 | | | 0 | 0 |

As demonstrated in Table IV, utilizing for the chemical polish the alkaline solutions of KOH, NaOH, NH$_4$, and OH with a pH of 10 or more, or H$_3$PO$_4$ as the chemical solution, led to a tendency for the N face to be selectively etched, and for the difference in height to increase. On the other hand, utilizing H$_2$O$_2$, HNO$_3$, H$_2$SO$_4$, HF, and HCl, did not lead increased height difference. In particular, H$_2$O$_2$ is preferable because it has weak corrosiveness, and thus the polishing system is unlikely to be damaged.

As described above, Experiment 5 demonstrated that when the wafer surface has an elemental III-substance face and an N face, the difference in height between the elemental III-substance face and the N face can be prevented from increasing by means of a III-V compound semiconductor substrate manufacturing method including: a chemical polishing step of chemically polishing the wafer surface; a cleaning step, subsequent to the chemical polishing process, of cleaning the wafer surface; and a dry-etching step, subsequent to the cleaning step, of subjecting the wafer surface to dry etching employing a halogen-containing gas; when as the chemical solution employed in the chemical polishing step, a solution containing at least one of aqueous hydrogen peroxide, sulfuric acid, hydrochloric acid, nitric acid, or hydrofluoric acid is utilized.

Experiment 6

GaAs substrates 2 inches in diameter and InP substrates 2 inches in diameter were prepared. Next, the substrate surfaces were polished with diamond wheels whose diamond abrasives have different average diameter. After that, the substrate surfaces were cleaned. Additionally, the substrate surfaces were dry-etched employing a plasma etching apparatus. The conditions under which dry etching were performed are shown below.

Antenna power: 800 W
Bias power: 200 W
Etch time: 90 seconds
Reaction gas: chlorine gas (Cl$_2$)
Reaction gas flow rate: 30 sccm
Pressure in chamber: 0.2 Pa Evaluation Result Substrate surface arithmetic-mean roughnesses (Ra$_{11}$) before, and substrate surface arithmetic-mean roughnesses (Ra$_{12}$) after, dry etching, were measured by AFM. The range in which the measurement was performed was defined as a rectangular area of 10 μm×10 μm on the substrates. The results are set forth in Table V. In table V, "○" represents that Ra$_{12}$ has gone smaller than Ra$_{11}$, and "×" represents that Ra$_{12}$ has gone greater than Ra$_{11}$.

TABLE V

| Substrate surface arithmetic-mean roughness before dry etching (Å) | GaAs substrate | InP substrate |
|---|---|---|
| 93 | × | × |
| 71 | × | × |
| 50 | ○ | ○ |
| 16 | ○ | ○ |

As just described, Experiment 6 demonstrated that surface roughness is reduced by means of a III-V compound semiconductor substrate manufacturing method including: a polishing step of polishing the wafer surface until the arithmetic-mean roughness of the wafer surface reaches 50 Å or less; a cleaning step, subsequent to the polishing step, of cleaning the wafer surface; and a dry-etching step, subsequent to the cleaning step, of subjecting the wafer surface to dry etching.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A III-V compound semiconductor substrate manufacturing method, comprising:

a polishing step of polishing the surface of a platelike III-V compound semiconductor crystal until the arithmetic-mean roughness of the surface decreases to a first roughness Ra$_1$ of 50 Å or less;

a cleaning step, subsequent to said polishing step, of cleaning the III-V compound semiconductor crystal surface;

a first dry-etching step, subsequent to said cleaning step, of applying first bias power to an electrode for carrying the III-V compound semiconductor crystal, and meanwhile subjecting the crystal surface to first dry-etching employing a first halogen-containing gas; and a second dry-etching step, subsequent to said first dry-etching step, of applying second bias power smaller than the first bias power to the electrode, and meanwhile subjecting the III-V compound semiconductor crystal surface to second dry-etching employing a second halogen-containing gas to thereby decrease the arithmetic-mean roughness of the surface to a second roughness Ra$_2$ that is less than said first roughness Ra$_1$, such that Ra$_2$/Ra$_1$ is less than 1.0 and such that the photoluminescent intensity through the semiconductor crystal is at least 30% enhanced over the crystal's photoluminescent intensity prior to said dry-etching steps.

2. A III-V compound semiconductor substrate manufacturing method as set forth in claim 1, wherein:

the III-V compound semiconductor crystal surface has an elemental III-substance face and an elemental V-substance face;

said polishing step comprises a chemical polishing process of subjecting the III-V compound semiconductor crystal surface to chemical polishing; and as at least one of a chemical solution employed in said chemical polishing process and a cleaning solution employed in said cleaning step, a solution containing at least one of aqueous hydrogen peroxide, sulfuric acid, hydrochloric acid, nitric acid, or hydrofluoric acid is utilized.

3. A III-V compound semiconductor substrate manufacturing method as set forth in claim 1, wherein:

the III-V compound semiconductor crystal surface has an elemental III-substance face and an elemental V-substance face;

said polishing step comprises a chemical polishing process of subjecting the III-V compound semiconductor crystal surface to chemical polishing; and as at least one of a chemical solution employed in said chemical polishing process and a cleaning solution employed in said cleaning step, a solution containing at least one of aqueous hydrogen peroxide, sulfuric acid, hydrochloric acid, nitric acid, or hydrofluoric acid is utilized.

4. A III-V compound semiconductor substrate manufacturing method as set forth in claim 1, wherein the III-V compound semiconductor crystal contains as the elemental III substance at least one of Ga, In, or Al, and contains as the elemental V substance at least one of As, P, or N.

5. A III-V compound semiconductor substrate manufacturing method as set forth in claim 1, wherein the III-V compound semiconductor crystal contains as the elemental III substance at least one of Ga, In, or Al, and contains as the elemental V substance at least one of As, P, or N.

6. A III-V compound semiconductor substrate manufacturing method as set forth in claim 1, wherein following said dry-etching steps, the photoluminescent intensity through the semiconductor crystal is at least 39% enhanced over the crystal's photoluminescent intensity prior to said dry-etching steps.

\* \* \* \* \*